United States Patent
Akamatsu et al.

(10) Patent No.: US 10,998,893 B2
(45) Date of Patent: May 4, 2021

(54) SEMICONDUCTOR DEVICE, DELAY CIRCUIT, AND RELATED METHOD

(71) Applicant: Micron Technology, Inc., Boise, ID (US)

(72) Inventors: Hiroshi Akamatsu, Boise, ID (US); Zhi Qi Huang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 16/085,870

(22) PCT Filed: Aug. 1, 2018

(86) PCT No.: PCT/CN2018/098031
§ 371 (c)(1),
(2) Date: Sep. 17, 2018

(87) PCT Pub. No.: WO2020/024149
PCT Pub. Date: Feb. 6, 2020

(65) Prior Publication Data
US 2020/0304113 A1    Sep. 24, 2020

(51) Int. Cl.
G11C 7/00 (2006.01)
H03K 5/134 (2014.01)
G11C 11/408 (2006.01)
H03K 5/131 (2014.01)

(52) U.S. Cl.
CPC ............ H03K 5/134 (2014.07); G11C 11/408 (2013.01); H03K 5/131 (2013.01)

(58) Field of Classification Search
CPC ....... H03K 5/134; H03K 5/131; G11C 11/408
USPC .................................................. 365/194, 193
See application file for complete search history.

(56) References Cited

U.S. PATENT DOCUMENTS

| | | | | |
|---|---|---|---|---|
| 4,800,304 A | * | 1/1989 | Takeuchi | H03K 5/131 327/279 |
| 5,315,549 A | * | 5/1994 | Scherpenberg | G11C 5/141 365/189.09 |
| 5,929,681 A | * | 7/1999 | Suzuki | G11C 7/20 327/262 |
| 5,946,244 A | * | 8/1999 | Manning | G11C 7/22 365/149 |
| 6,097,231 A | | 8/2000 | Moscaluk | |
| 6,201,437 B1 | * | 3/2001 | Kono | G05F 1/465 327/143 |

(Continued)

FOREIGN PATENT DOCUMENTS

CN    101330285 A    12/2008
CN    201774508 U    3/2011

(Continued)

OTHER PUBLICATIONS

International Written Opinion from International Application No. PCT/CN2018/098031, dated May 9, 2019 4 pages.

(Continued)

*Primary Examiner* — Viet Q Nguyen
(74) *Attorney, Agent, or Firm* — TraskBritt

(57) ABSTRACT

Methods and apparatus for generating a delayed output signal from an input signal applied to an RC delay circuit of a semiconductor device during an active mode. The RC delay circuit is configured to pull up a voltage level on a node responsive to a reset signal during a stand-by mode.

21 Claims, 11 Drawing Sheets

(56) References Cited

U.S. PATENT DOCUMENTS

| | | | |
|---|---|---|---|
| 6,320,443 B1 | 11/2001 | Jeong | |
| 6,570,813 B2* | 5/2003 | Van De Graaff | G11C 7/1066 |
| | | | 365/189.05 |
| 6,838,712 B2* | 1/2005 | Stubbs | G11C 7/1078 |
| | | | 257/194 |
| 7,167,400 B2* | 1/2007 | Lovett | G11C 11/406 |
| | | | 365/194 |
| 7,289,378 B2* | 10/2007 | Ivanov | G11C 7/22 |
| | | | 365/190 |
| 7,453,746 B2* | 11/2008 | Ivanov | G11C 7/1093 |
| | | | 365/194 |
| 8,351,174 B1* | 1/2013 | Gardner | H02H 3/243 |
| | | | 361/92 |
| 8,730,742 B2 | 5/2014 | Akamatsu et al. | |
| 8,737,158 B2 | 5/2014 | Matsunaga et al. | |
| 9,660,664 B1* | 5/2017 | Price | H03M 1/125 |
| 2002/0048191 A1* | 4/2002 | Ikehashi | G11C 29/12 |
| | | | 365/185.22 |
| 2003/0231035 A1* | 12/2003 | Govil | H03K 17/223 |
| | | | 327/143 |
| 2005/0001666 A1* | 1/2005 | Tanaka | H03K 5/13 |
| | | | 327/261 |
| 2005/0030079 A1* | 2/2005 | Ku | H03K 5/082 |
| | | | 327/263 |
| 2007/0274132 A1* | 11/2007 | Ogiwara | G11C 5/14 |
| | | | 365/185.23 |
| 2010/0039155 A1 | 2/2010 | Chang | |
| 2011/0133808 A1 | 6/2011 | Akamatsu | |
| 2012/0155144 A1* | 6/2012 | Xia | G11C 11/22 |
| | | | 365/145 |
| 2013/0107638 A1* | 5/2013 | Fujita | G11C 11/1693 |
| | | | 365/189.05 |
| 2014/0233334 A1 | 8/2014 | Matsunaga et al. | |
| 2016/0232982 A1* | 8/2016 | Ito | G11C 7/1063 |
| 2017/0317672 A1* | 11/2017 | Gupta | H03K 17/223 |
| 2018/0075922 A1 | 3/2018 | Akamatsu | |
| 2018/0158504 A1 | 6/2018 | Akamatsu | |
| 2018/0331682 A1* | 11/2018 | Duduman | H02M 1/38 |

FOREIGN PATENT DOCUMENTS

| | | | | |
|---|---|---|---|---|
| CN | 102035511 A | | 4/2011 | |
| CN | 106936414 A | | 7/2017 | |
| JP | 2006-140284 A | | 6/2006 | |
| JP | 2010049707 A | * | 3/2010 | G06F 1/24 |
| JP | 2013-093513 A | | 5/2013 | |

OTHER PUBLICATIONS

International Search Report from International Application No. PCT/CN2018/098031, dated May 9, 2019 4 pages.

* cited by examiner

US 10,998,893 B2

SEMICONDUCTOR DEVICE, DELAY CIRCUIT, AND RELATED METHOD

CROSS-REFERENCE TO RELATED APPLICATION

This application is a national phase entry under 35 U.S.C. § 371 of International Patent Application PCT/CN2018/098031, filed Aug. 1, 2018, designating the United States of America.

TECHNICAL FIELD

Embodiments disclosed herein relate to semiconductor devices. More particularly, embodiments disclosed herein relate to devices and methods for incorporating an RC delay circuit with a reset signal.

BACKGROUND

Variations that are of interest in semiconductor devices are typically grouped into three different types: process variations (P), voltage variations (V), and temperature variations (T). These variations together comprise PVT variations. Semiconductors often include resistive-capacitive (RC) delay circuits to introduce delay into control signals to mitigate PVT variation dependency, especially for array control timing adjustment. The output of the driving inverter becomes slanted due to the RC time constant of the load and the output inverter also decides the RC delay trip point. Consequently, the output timing of the inverter may be vulnerable to its PMOS threshold voltage (Vth) fluctuation according to its negative bias temperature instability (NBTI) stress degradation, which manifests as an increase in the threshold voltage and consequent decrease in drain current of the MOSFET.

FIG. 1 is a schematic diagram of a conventional RC delay circuit 100 for control signals of a memory array. The RC delay circuit 100 includes inverters that are serially coupled together to receive an input signal DELAY_IN and generate a delayed output signal DELAY_OUT. In particular, the RC delay circuit 100 includes a first inverter 102, a second inverter 104, a first RC load inverter 106, a third inverter 116, a fourth inverter 118, a second RC load inverter 120, a fifth inverter 130, and a sixth inverter 132 serially coupled with each other. The first RC load inverter 106 and the second RC load inverter 120 have RC time constants as will be discussed below, whereas the other inverters 102, 104, 116, 118, 130, 132 do not have RC time constants associated therewith.

The first RC load inverter 106 includes a first transistor 108 and a second transistor 110 having a resistor 112 therebetween. The output (Node A) of the first RC load inverter 106 is also coupled to a capacitor 114 that, with resistor 112 provides an RC time constant for the output signal on Node A. The third inverter 116 and the fourth inverter 118 may be coupled in series between the output of the first RC load inverter 106 and the input to the second RC load inverter 120.

The second RC load inverter 120 includes a first transistor 122 and a second transistor 124 having a resistor 126 therebetween. The output (Node C) of the second RC load inverter 120 is also coupled to a capacitor 128 that, with resistor 126, provides an RC time constant for the output signal on Node C. The output of the second RC load inverter 120 may also be coupled to the fifth inverter 130 and the sixth inverter 132.

FIG. 2 is a timing diagram 200 showing waveforms for each input (DELAY_IN), output (DELAY_OUT), and various internal nodes of FIG. 1 in the scenario of no NBTI stress degradation. The RC delay circuit 100 may operate according to the following modes: active mode and pre-charge mode. Active mode may be defined by the input signal DELAY_IN being asserted. Stand-by mode may be defined by the input signal DELAY_IN being deasserted.

In operation, responsive to the input signal DELAY_IN switches from low to high, the output of the first RC load inverter 106 on node A may switch from high to low. The signal on node A is slanted according to the RC time constant of the resistor 112 and the capacitor 114 of the first RC load inverter 106. In addition, the output of the second RC load inverter 120 on node C may switch from low to high. The signal on node C is also slanted according to the time constant of the resistor 126 and the capacitor 128 of the second RC load inverter 120. The output signal DELAY_OUT switches from low to high according to a delay determined from the different inverter stages. The delay timing for the output signal DELAY_OUT may be determined by the number of delay stages.

FIG. 3 is a timing diagram 300 showing waveforms for each input (DELAY_IN), output (DELAY_OUT), and various internal nodes of FIG. 1 in the scenario of NBTI stress degradation. The PMOS transistor within the third inverter 116 may be degraded due to the NBTI stress because the Node A is low during the active stand-by state. As a result, the rise timing of the Node B may be delayed due to the PMOS threshold voltage Vth shift. The PMOS transistor within the fifth inverter 130 may also be degraded; however, the fall timing of the Node D is approximately the same because the Node D fall timing may be dominated by the NMOS transistor of the fifth inverter 130.

BRIEF SUMMARY

In an embodiment, a semiconductor device comprises a first delay circuit and a second delay circuit coupled in series between a first node and a second node in a delay path for the semiconductor device, and having a third node therebetween, and a third circuit coupled to the third node and configured to charge the third node responsive to detecting a signal has passed through the first node and the third node.

In another embodiment, an RC delay circuit comprises a first RC load inverter including a first transistor and a second transistor operably coupled as an inverter having a common input and a common output node, a resistor operably coupled between the first transistor and the second transistor, a capacitor operably coupled at the output node, and a delay element coupled at the output node of the first RC load inverter configured to perform an inverter operation on a signal received from the first RC load inverter. The RC delay circuit is configured to pull up a voltage level of the output node of the first RC load transistor responsive to a reset signal during a stand-by mode.

In a further embodiment, a method of operating a semiconductor device comprises receiving an input signal at an RC delay circuit having multiple delay stages in a delay path, generating a delayed output signal during an active mode of the RC delay circuit, and pulling at least one node of the delay path to a voltage level responsive to a reset signal during a stand-by mode of the RC delay circuit.

DETAILED DESCRIPTION

Figure 1:
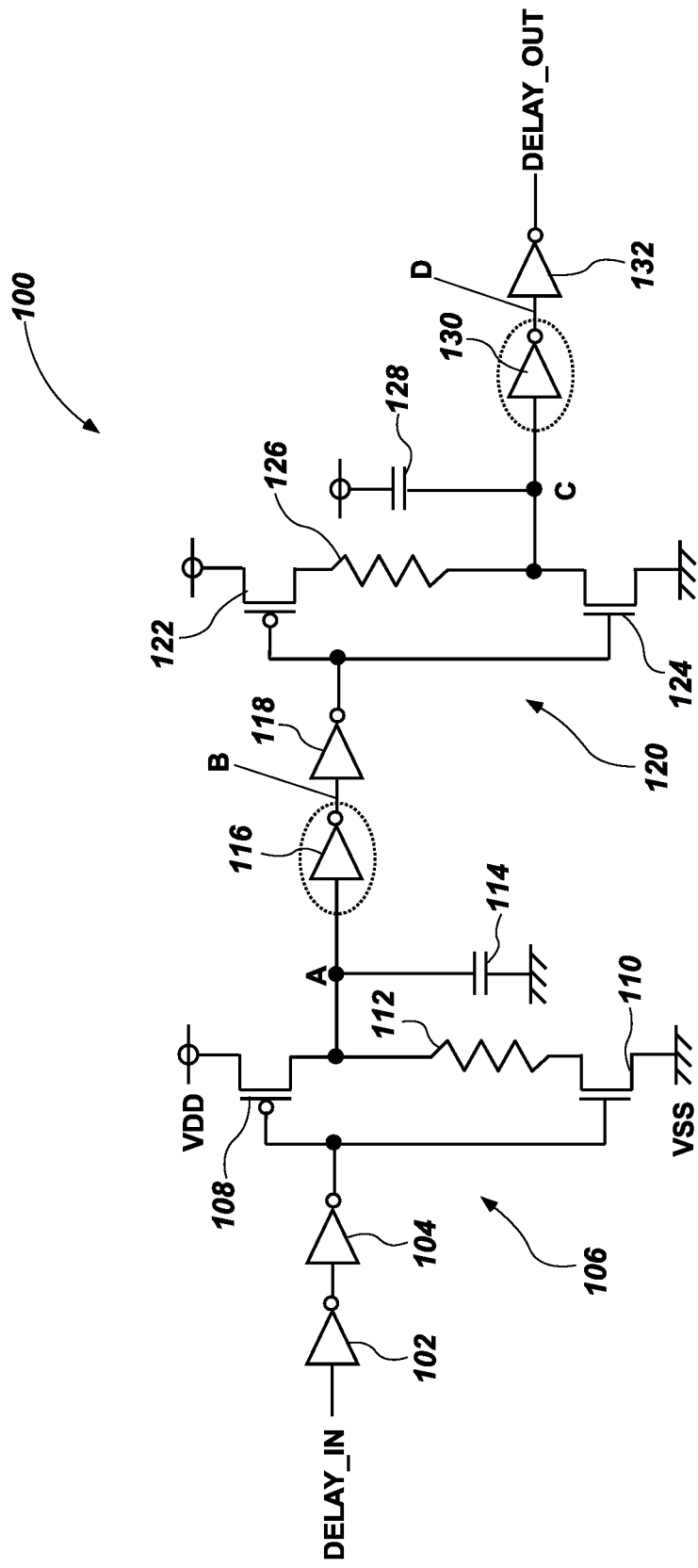
FIG. 1 is a schematic diagram of a conventional RC delay circuit for control signals of a memory array.
Figure 2:
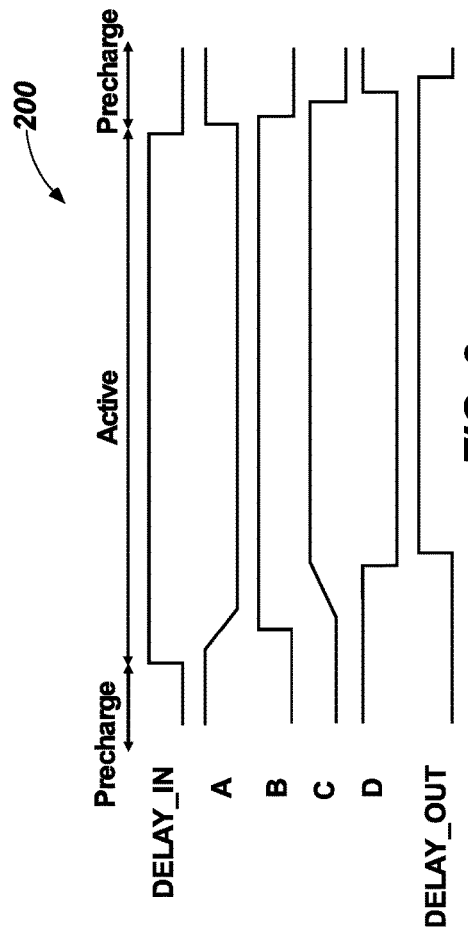
FIG. 2 is a timing diagram showing waveforms for each input, output, and various internal nodes of FIG. 1.
Figure 3:
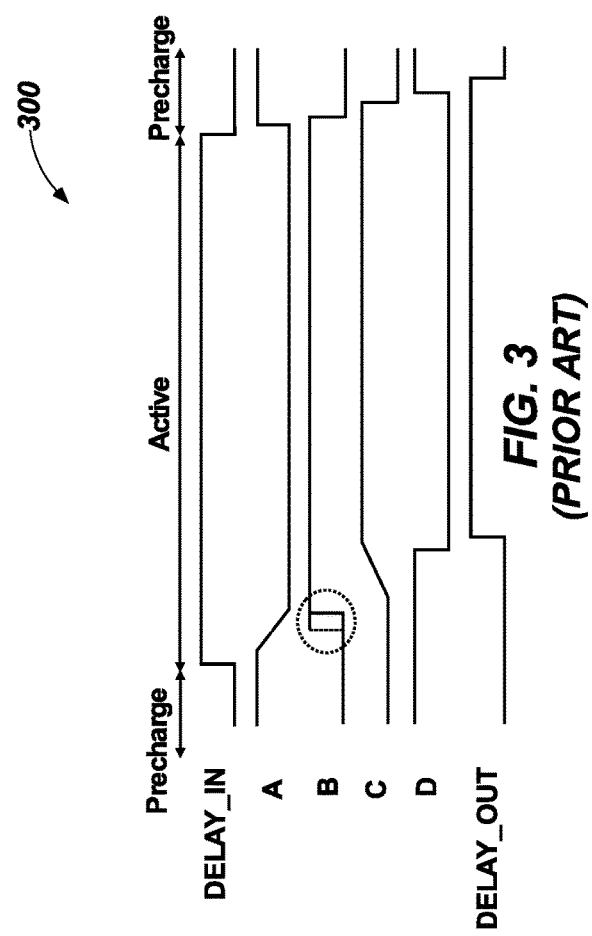
FIG. 3 is a timing diagram showing waveforms for each input (DELAY_IN), output (DELAY_OUT), and various internal nodes of FIG. 1 in the scenario of NBTI stress degradation.

Apparatus and methods for adding delay to control signals are described below. For example, DRAM array control signals may be stabilized using an RC delay circuit. An RC delay in this disclosure may be configured with a NAND gate with a reset function to reduce the NBTI stress degradation. One or more node in the RC delay may be precharged to a voltage level by a pull-up transistor (e.g., PMOS transistor) in the NAND gate with the reset signal during a stand-by mode. Embodiments of the disclosure may include a semiconductor device comprising a first delay circuit and a second delay circuit coupled in series between a first node and a second node in a delay path for the semiconductor device, and having a third node therebetween, and a third circuit coupled to the third node and configured to charge the third node responsive to detecting a signal has passed through the first node and the third node. In some embodiments, the third circuit may be configured to start charging the third node before the signal gets to the second node. The some embodiments, the first circuit may be configured to change a voltage of the third node from a first voltage to a second voltage responsive to the signal, and the third circuit may be configured to change the voltage of the third node from the second voltage to the first voltage by charging the third node.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Drawings presented herein are for illustrative purposes only, and are not meant to be actual views of any particular component, structure, device, waveform, or system. Drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "assert" in reference to a signal refers to a condition in which the signal triggers a first action or set of actions, whereas the term "deassert" refers to the opposite condition in which the signal triggers a second action or set of actions.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

In the specification and with reference to the accompanying drawing figures, the same or similar elements are identified by the same or similar reference numerals for the sake of clarity.

Embodiments of the disclosure include an RC delay circuit comprises a first RC load inverter including a first transistor and a second transistor operably coupled as an inverter having a common input and a common output node, a resistor operably coupled between the first transistor and the second transistor, a capacitor operably coupled at the output node, and a delay element coupled at the output node of the first RC load inverter configured to perform an inverter operation on a signal received from the first RC load inverter. The RC delay circuit is configured to pull up a voltage level of the output node of the first RC load transistor responsive to a reset signal during a stand-by mode. In some embodiments, the reset signal may be an external signal from a controller. In other embodiments, the reset signal may be generated internal to the RC delay circuit.

Figure 4:
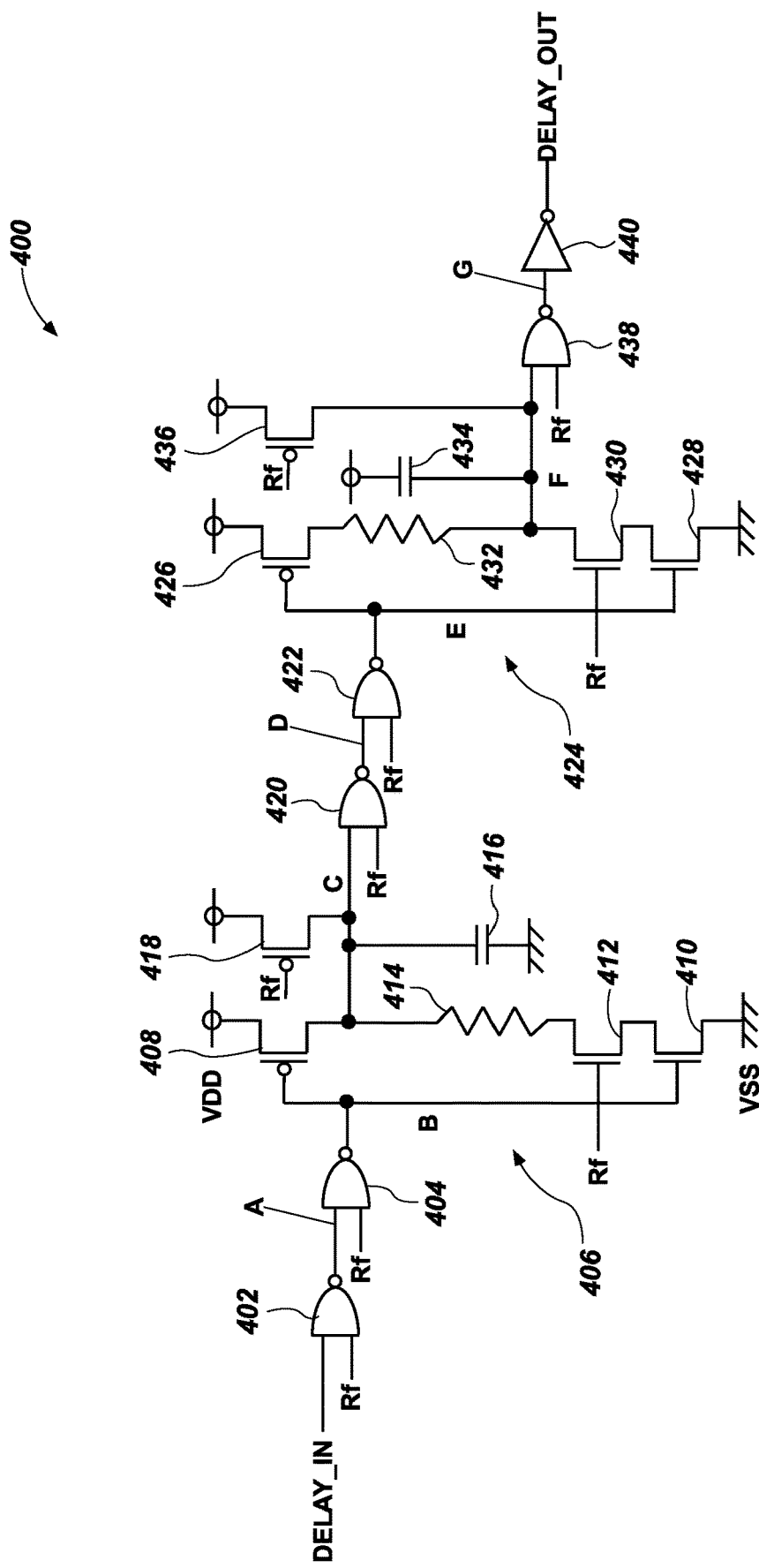
FIG. 4 is a schematic diagram of an RC delay circuit for control signals of a memory array according to an embodiment of the disclosure.

FIG. 4 is a schematic diagram of an RC delay circuit 400 for control signals of a memory array according to an embodiment of the disclosure. The RC delay circuit 400 includes a series of intermediate circuits (also referred to as "delay elements") coupled together to receive an input signal DELAY_IN and generate a delayed output signal DELAY_OUT. In particular, the delay elements of the RC delay circuit 400 include a first NAND gate 402 and a second NAND gate 404 operably coupled to a first RC load inverter 406 having an RC time constant. The output of the first NAND gate 402 may be coupled to one of the inputs of the second NAND gate 404 at Node A. The output of the second NAND gate 404 may be coupled to the input to the first RC load inverter 406 at node B. The other input to the NAND gates 402, 404 may be a reset signal Rf.

The first RC load inverter 406 includes a first transistor 408 (e.g., PMOS transistor) and a second transistor 410 (e.g., NMOS transistor) coupled together as an inverter with their gates coupled to a common terminal to receive an input signal. The first transistor 408 and the second transistor 410 have a resistor 414 coupled therebetween. The output (Node C) of the first RC load inverter 406 is also coupled to a capacitor 416 that, with resistor 414 provides the RC time constant for the output signal on Node C. A third transistor 412 (e.g., NMOS transistor) may also be part of the first RC load inverter 406 coupled with the first transistor 408 and the second transistor 410 that may used to enable the first RC load inverter 406. As an example, the third transistor 412 may be coupled between the first transistor 408 and the second transistor 410, such as between the resistor 414 and the second transistor 410. In some embodiments, the third transistor 412 may be coupled between the second transistor 410 and the low voltage side of the power supply (e.g., ground). The input controlling the third transistor 412 of the first RC load inverter 406 may be the reset signal Rf.

Another transistor 418 (e.g., PMOS transistor) may be coupled to the output at Node C. The input controlling the transistor 418 coupled between VDD and Node C may also be the reset signal Rf. Thus, when the transistor 418 is enabled by the reset signal Rf, the voltage level on Node C may be precharged (i.e., set, pulled up) to VDD or other voltage level provided. As a result, the transistor 418 may be configured to be enabled such that Node C begins charging before the signal reaches Node F.

The third NAND gate 420 and the fourth NAND gate 422 may be coupled in series between the output of the first RC load inverter 406 and the input to the second RC load inverter 424. The output of the third NAND gate 420 may be coupled to one of the inputs of the fourth NAND gate 422 at Node D. The output of the fourth NAND gate 422 may be coupled to the input to the second RC load inverter 424 at node E. The other input to the NAND gates 420, 422 may be the reset signal Rf.

The second RC load inverter 424 includes a first transistor 426 (e.g., PMOS transistor) and a second transistor 428 (e.g., NMOS transistor) having a resistor 432 therebetween. A third transistor 430 (e.g., NMOS transistor) may also be coupled between the first transistor 426 and the second transistor 428, such as between the resistor 432 and the second transistor 428. The output (Node F) of the second RC load inverter 424 is also coupled to a capacitor 434 that, with resistor 432, provides the RC time constant for the output signal on Node F. The input controlling the third transistor 430 of the second RC load inverter 424 may be the reset signal Rf. Another transistor 436 (e.g., PMOS transistor) may be coupled to the output at Node F. The input controlling the transistor 436 coupled between VDD and Node C may also be the reset signal Rf. The output of the second RC load inverter 424 may be coupled at Node F to the input of the sixth NAND gate 438, with its output coupled at Node G to the input of inverter 440 to generate the delayed output signal DELAY_OUT. The other input to the sixth NAND gate 438 may also be the reset signal. Thus, each node within the delay path may be reset to the VDD level responsive to the reset signal RF to mitigate NBTI stress degradation as discussed below. Although supply voltage (VDD) is described as the pull-up voltage level, other voltage levels are also contemplated including a peripheral voltage (VPERI), an array voltage (VARY), or some other reference voltage.

Embodiments of the disclosure further include a method of operating a semiconductor device comprises receiving an input signal at an RC delay circuit having multiple delay stages in a delay path, generating a delayed output signal during an active mode of the RC delay circuit, and pulling at least one node of the delay path to a voltage level responsive to a reset signal during a stand-by mode of the RC delay circuit.

Figure 5:
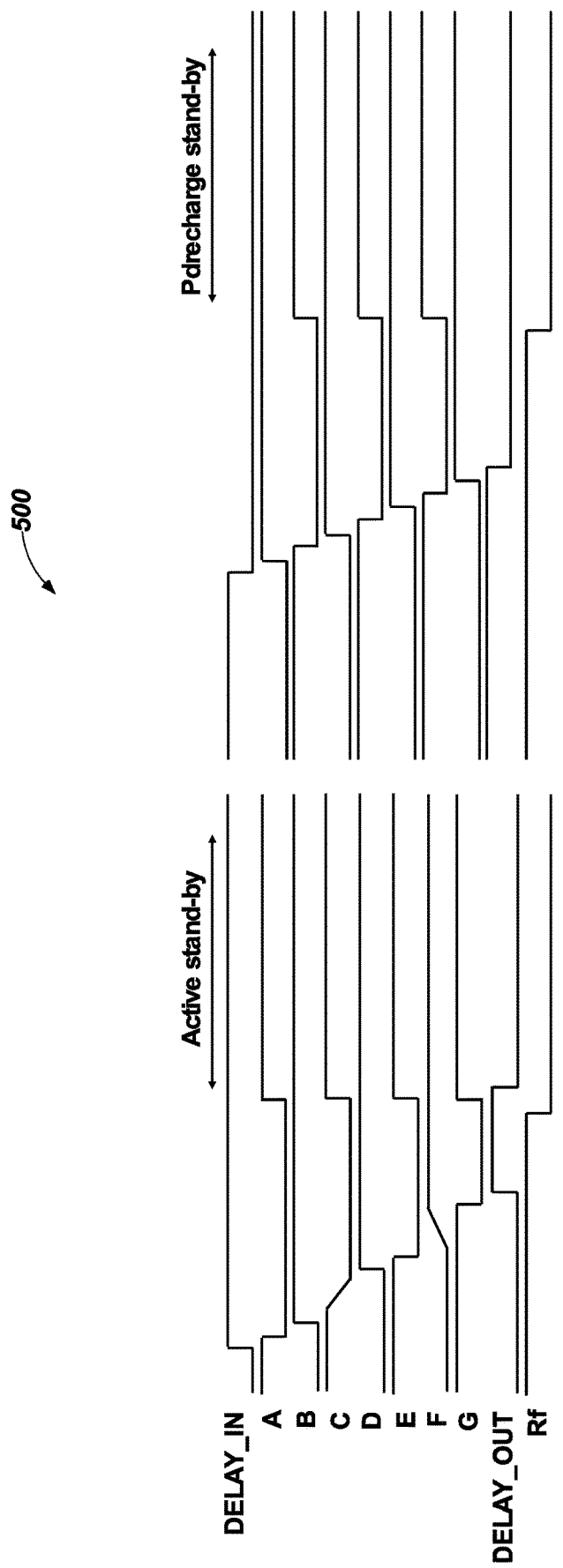
FIG. 5 is a timing diagram showing waveforms for each input, output, and various internal nodes of FIG. 4.

FIG. 5 is a timing diagram 500 showing waveforms for each input (DELAY_IN), output (DELAY_OUT), reset signal Rf, and various internal nodes of FIG. 4. The RC delay circuit 400 may operate according to the following modes: active mode, active stand-by mode, precharge mode, and precharge stand-by mode. Active mode may be defined by the input signal DELAY_IN being asserted while the reset signal Rf is also asserted. Active stand-by mode may be defined by the input signal DELAY_IN being asserted while the reset signal Rf is deasserted (i.e., triggering the reset functionality according to this implementation). Precharge mode may be defined by the input signal DELAY_IN being deasserted while the reset signal Rf is asserted. Precharge stand-by mode may be defined by the input signal DELAY_IN being deasserted while the reset signal Rf is also deasserted (i.e., triggering the reset functionality according to this implementation).

In operation, responsive to the input signal DELAY_IN active mode and switches from low to high (and with the reset signal Rf set high), the output at Node A switches from high to low, the output at Node B switches from low to high, the output at Node C switches from high to low, the output at Node D switches from low to high, the output at Node E switches from high to low, the output at Node F switches from low to high, the output at Node G switches from high to low, and the delayed output signal DELAY_OUT switches from low to high. Thus, the output at each node alternates between low to high—meaning that each NAND gate of FIG. 4 functionally operates as an inverter adding some amount of delay to the delayed output signal DELAY_OUT according to the number of delay element stages. The signals on nodes C and F are slanted according to the RC time constants of the first RC load inverter 406 and the second RC load inverter 424, respectively. The output signal DELAY_OUT switches from low to high according to a delay determined from the different inverter stages.

The reset signal Rf may switch from high to low during the active stand-by state mode. In response to the reset signal Rf switching from high to low, each node (e.g., nodes A-G) in the RC delay path may be coupled to VDD causing each node to set high. In this case, Nodes A, C, E, and G may switch from low to high, while nodes B, D, and F may remain high. Each node in the RC delay is set high by Rf. Because of this reset function responsive to the reset signal Rf, NBTI stress may be reduced (e.g., substantially or eliminated) at each node in the RC delay path.

Precharge mode may similarly cause the different nodes to alternate between low and high throughout the RC delay circuit responsive to the input signal DELAY_IN and the reset signal Rf each being deasserted. Precharge stand-by mode may also cause each node (e.g., nodes A-G) in the RC delay path to be coupled to VDD. In this case, Nodes B, D, and F may switch from low to high, while Nodes A, C, E, and G may remain high. Because of this reset function responsive to the reset signal Rf, NBTI stress may be reduced (e.g., substantially or eliminated) at each node in the RC delay path.

Figure 6:
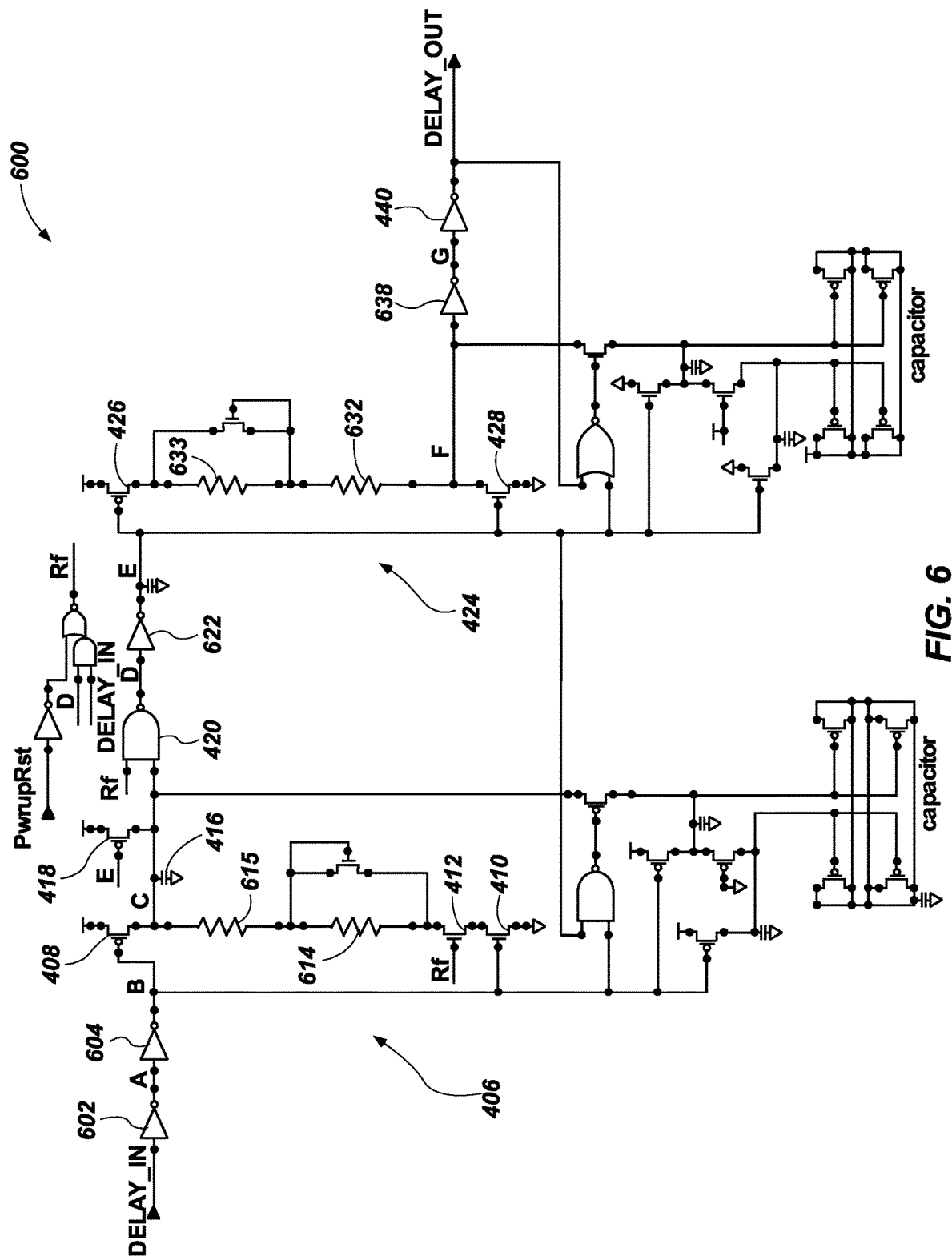
FIG. 6 is a schematic diagram of an RC delay circuit for control signals of a memory array according to another embodiment of the disclosure.

FIG. 6 is a schematic diagram of an RC delay circuit 600 for control signals of a memory array according to another embodiment of the disclosure. The RC delay circuit 600 may include a series of delay elements coupled together to receive an input signal DELAY_IN and generate a delayed output signal DELAY_OUT. While other circuit elements are shown in FIG. 6 providing additional circuitry for capacitive elements for the RC time constant, the focus of the description is on the delay elements of the delay path. In particular, the delay elements of the RC delay circuit 600 may be configured similarly to that of FIG. 4 in terms of those elements that retain the same numerical designation. In FIG. 6, inverters 602, 604, 622, 638 have replaced NAND gates 402, 404, 422, 438 (FIG. 4), respectively. As a result, NAND gate 420 is the only NAND gate in the delay path configured with reset functionality by receiving the reset signal Rf as an input. The transistor 418 coupled to Node C with reset functionality. In FIG. 6, the input to transistor 418 may be coupled to Node E, which has a signal that is responsive to the reset signal Rf received by the NAND gate 420. As a result, the transistor 418 may be enabled indirectly responsive to the reset signal Rf even if it does not directly receive the reset signal Rf. In operation, the reset signal Rf may cause Nodes D, E, and then C to be pulled to VDD during a stand-by mode to mitigate NBTI stress on node C. By using inverters and only one NAND gate in the delay path, the physical layout area of the delay elements of FIG. 6 may be reduced relative to FIG. 4.

Additional minor differences may exist between FIG. 6 and FIG. 4 including the first RC load inverter 406 including two resistors 614, 615, and the second RC load inverter 424 including two resistors 632, 633. In addition, FIG. 6 shows that the reset signal Rf may be derived by another signal such as a power-up signal (e.g., PwrupRst).

Figure 7:
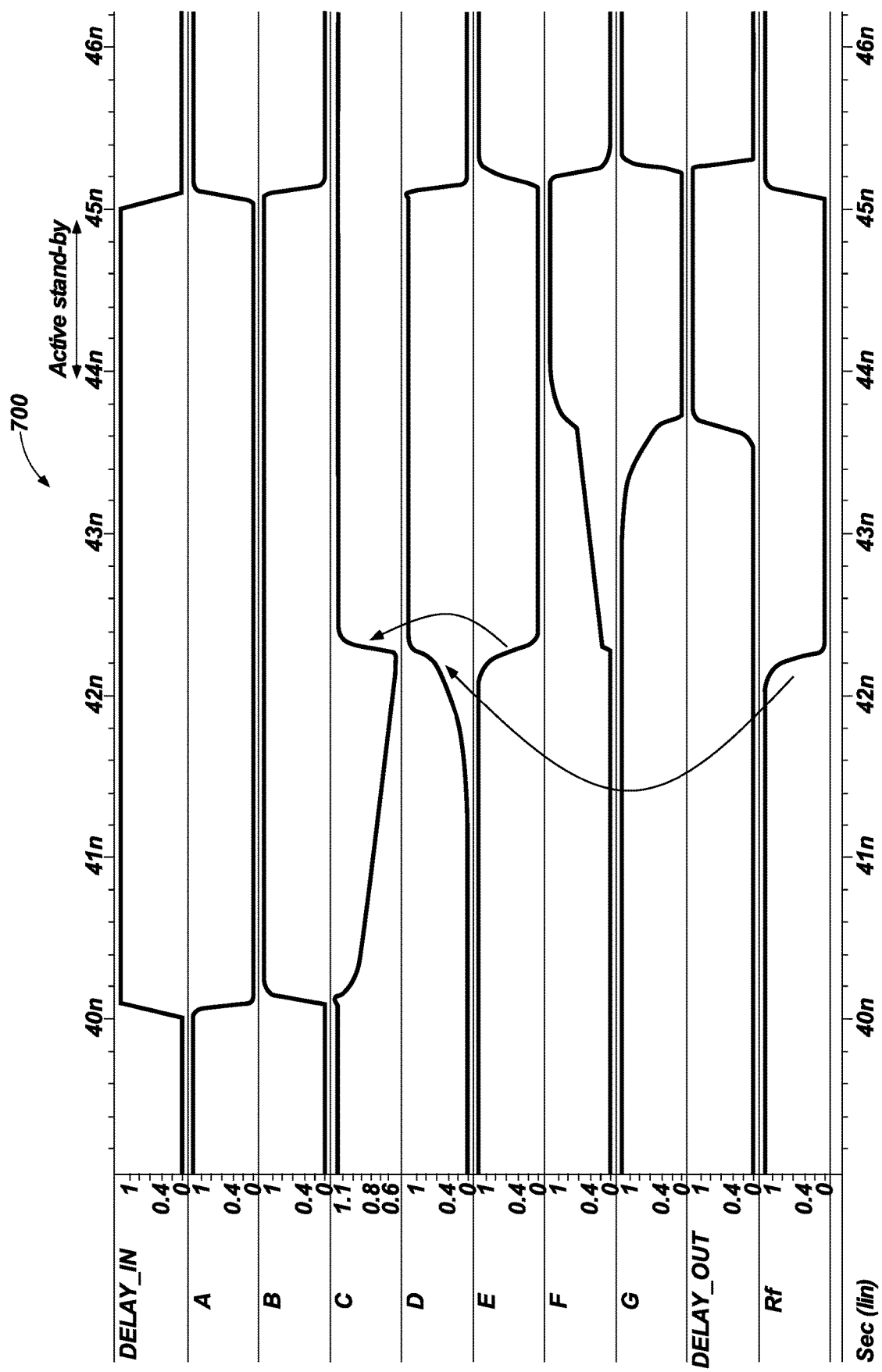
FIG. 7 is a timing diagram showing waveforms for each input, output, reset signal Rf, and various internal nodes of FIG. 6.

FIG. 7 is a timing diagram 700 showing waveforms for each input (DELAY_IN), output (DELAY_OUT), reset signal Rf, and various internal nodes of FIG. 6. As discussed above, the RC delay circuit 600 may operate according to the following modes: active mode, active stand-by mode, precharge mode, and precharge stand-by mode.

In operation, responsive to the input signal DELAY_IN enters active mode and switches from low to high (and with the reset signal Rf set high), the output at Node A switches from high to low, the output at Node B switches from low to high, the output at Node C switches from high to low, the output at Node D switches from low to high, the output at Node E switches from high to low, the output at Node F switches from low to high, the output at Node G switches from high to low, and the delayed output signal DELAY_OUT switches from low to high. Thus, the output at each node alternates between low to high. The signals on Nodes C and F are slanted according to the RC time constants of the first RC load inverter 406 and the second RC load inverter 424, respectively. Nodes D and G may be slightly slanted due to the threshold voltages Vth of the transistors and the sloped inputs received from Nodes C and F.

In response to the reset signal Rf, Nodes D, E, and then C to be pulled to VDD during a stand-by mode to mitigate NBTI stress on node C. In particular, Node C is set high by the falling edge of Node E, and Node D is set high by the falling edge of reset signal Rf. When Node E becomes low, the first stage delay from Node B to Node C may be complete such that both Node C and Node D are able to be reset to high (e.g., VDD). NBTI stress at Node C may be minimized by the node reset function because Node C is pulled high except for the period when the delay is intended to be active.

Figure 8:
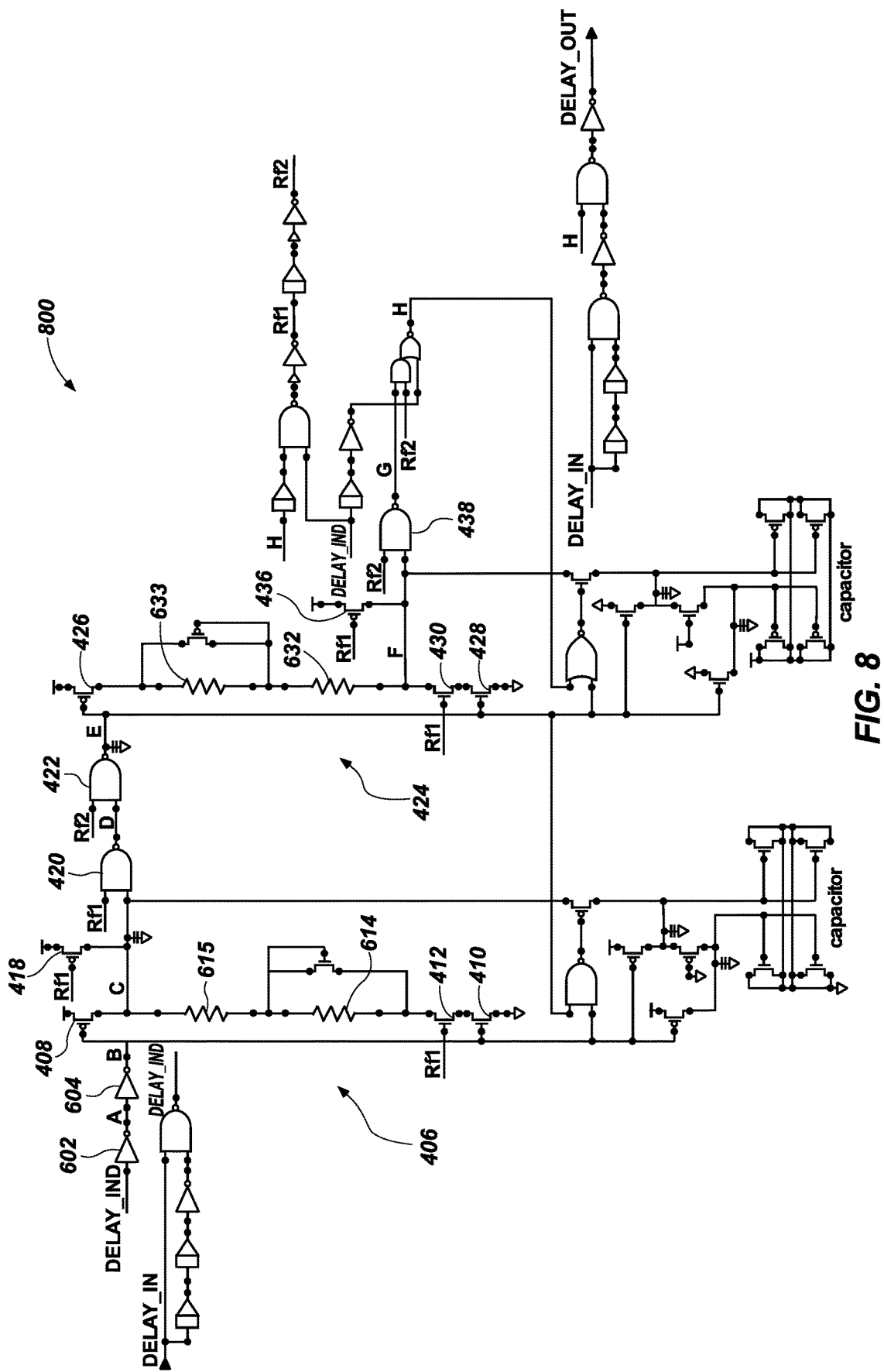
FIG. 8 is a schematic diagram of an RC delay circuit for control signals of a memory array according to another embodiment of the disclosure.

FIG. 8 is a schematic diagram of an RC delay circuit 800 for control signals of a memory array according to another embodiment of the disclosure. The RC delay circuit 800 may include a series of delay elements coupled together to receive an input signal DELAY_IN and generate a delayed output signal DELAY_OUT. While other circuit elements are shown in FIG. 8 providing additional circuitry for capacitive elements for the RC time constant, the focus of the description is on the delay elements of the delay path. In particular, the delay elements of the RC delay circuit 800 may be configured similarly to that of FIG. 4 in terms of those elements that retain the same numerical designation. In FIG. 8, inverters 602, 604 have replaced NAND gates 402, 404 (FIG. 4), respectively. As a result, NAND gates 420, 422, 438 are located in the delay path and configured with reset functionality by receiving either the first reset signal Rf1 or the second reset signal Rf2 as an input. The transistor 418 may also be coupled to Node C with reset functionality by receiving the first reset signal Rf1. When enabled, the transistor 418 may precharge (i.e., set, pull up) the voltage on Node C to a voltage level VDD or other voltage level during a stand-by mode to mitigate NBTI stress on node C. As a result, NBTI stress degradation may be reduced on Nodes C to H responsive to the reset signals Rf1, Rf2. Different nodes may be controlled by different reset signals Rf1, Rf2, whereas some embodiments discussed above may be controlled by the same reset signal. In addition, it is noted that the reset signals Rf1, Rf2 may be generated internally to the RC delay circuit 800 rather than being a separate signal received from an external controller. For example, the first and second reset signals Rf1, Rf2 may be derived from the input signal or modified input signal and the output node (Node H) of the RC delay circuit 800. The second reset signal Rf2 may be a slightly delayed version of the first reset signal Rf1.

Additional minor differences may exist between FIG. 8 and FIG. 4 including the input signal DELAY_IN may pass through a number of delay elements before being received by the RC delay circuit as modified input DELAY IND. Similarly, the delayed output signal may also be generated by a NAND gate that is controlled by the input signal DELAY_IN and the output node (Node H) of the RC delay circuit 800.

Figure 9:
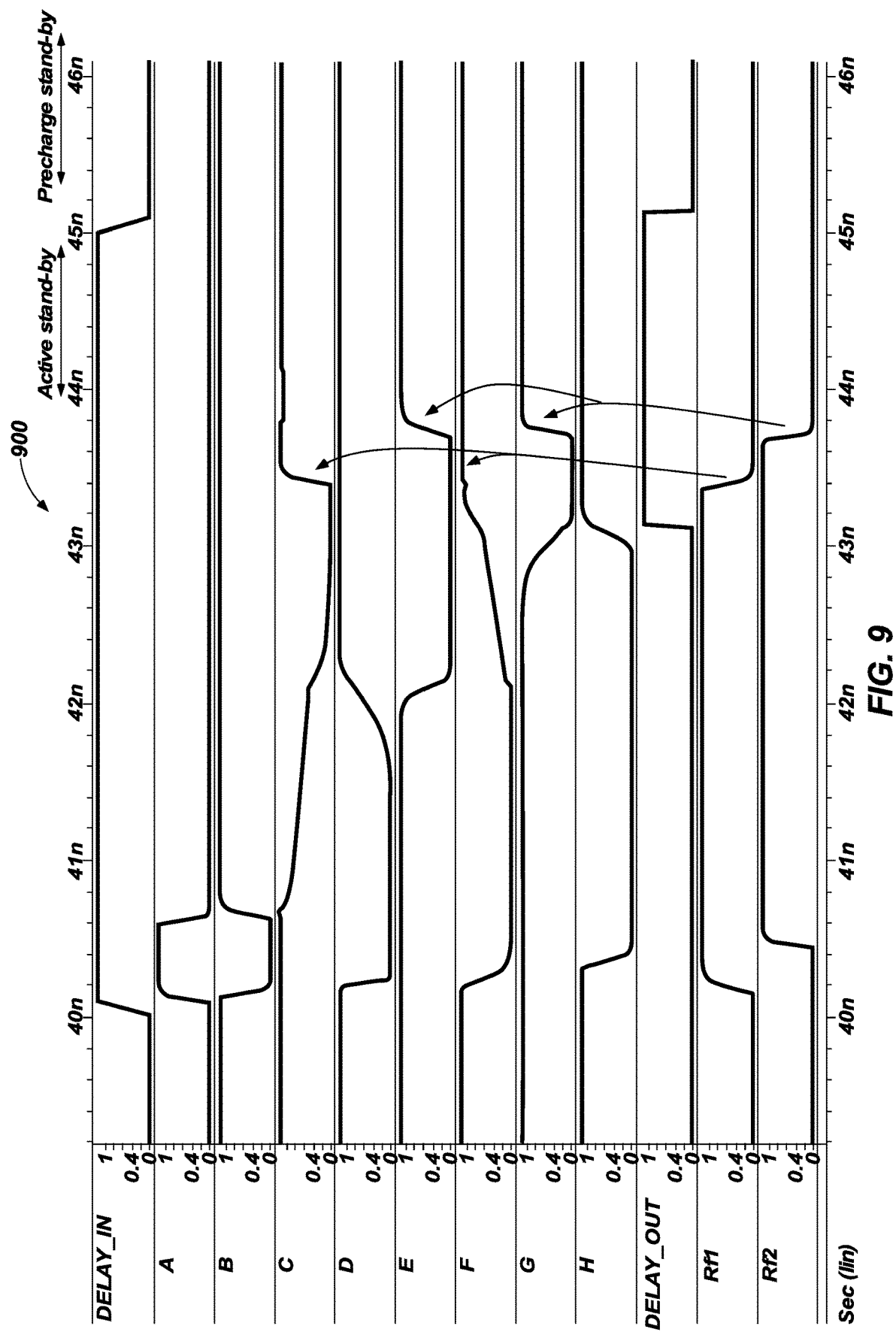
FIG. 9 is a timing diagram showing waveforms for each input (DELAY_IN), output (DELAY_OUT), reset signal Rf1, reset signal Rf2, and various internal nodes of FIG. 8.

FIG. 9 is a timing diagram 900 showing waveforms for each input (DELAY_IN), output (DELAY_OUT), reset signal Rf1, reset signal Rf2, and various internal nodes of FIG. 8.

In operation, nodes B through H are precharged to a voltage level (e.g., VDD) with both reset signals Rf1, Rf2 being low. Responsive to the input signal DELAY_IN enters active mode and switches from low to high (and with the reset signal Rf1 set high), the output at Node A switches from low to high and the output at Node B switches from high to low. The second delay signal Rf2 may be slightly delayed from the first delay signal Rf1. As a result, the output at Node C is precharged at VDD and decreases from high to low responsive to the second reset signal Rf2, and the output at Node D increases from low to high, the output at Node E switches from high to low, the output at Node F switches from low to high, the output at Node G switches from high to low, and the delayed output signal DELAY_OUT switches from low to high. The signals on Nodes C, D, F, and G are slanted according to the RC time constants. When the second from last signal (Node H) switches from low to high, the reset signals Rf1 and Rf2 are set to low respectively with some gate delay. The falling edge of the first reset signal Rf1 resets Node C and Node F. The falling edge of the second reset signal Rf2 resets Nodes E and G. The reset function of reset signals Rf1 and Rf2 may enable each node in the RC delay path to be set high during both active and precharge stand-by states to mitigate the NBTI stress.

Figure 10:
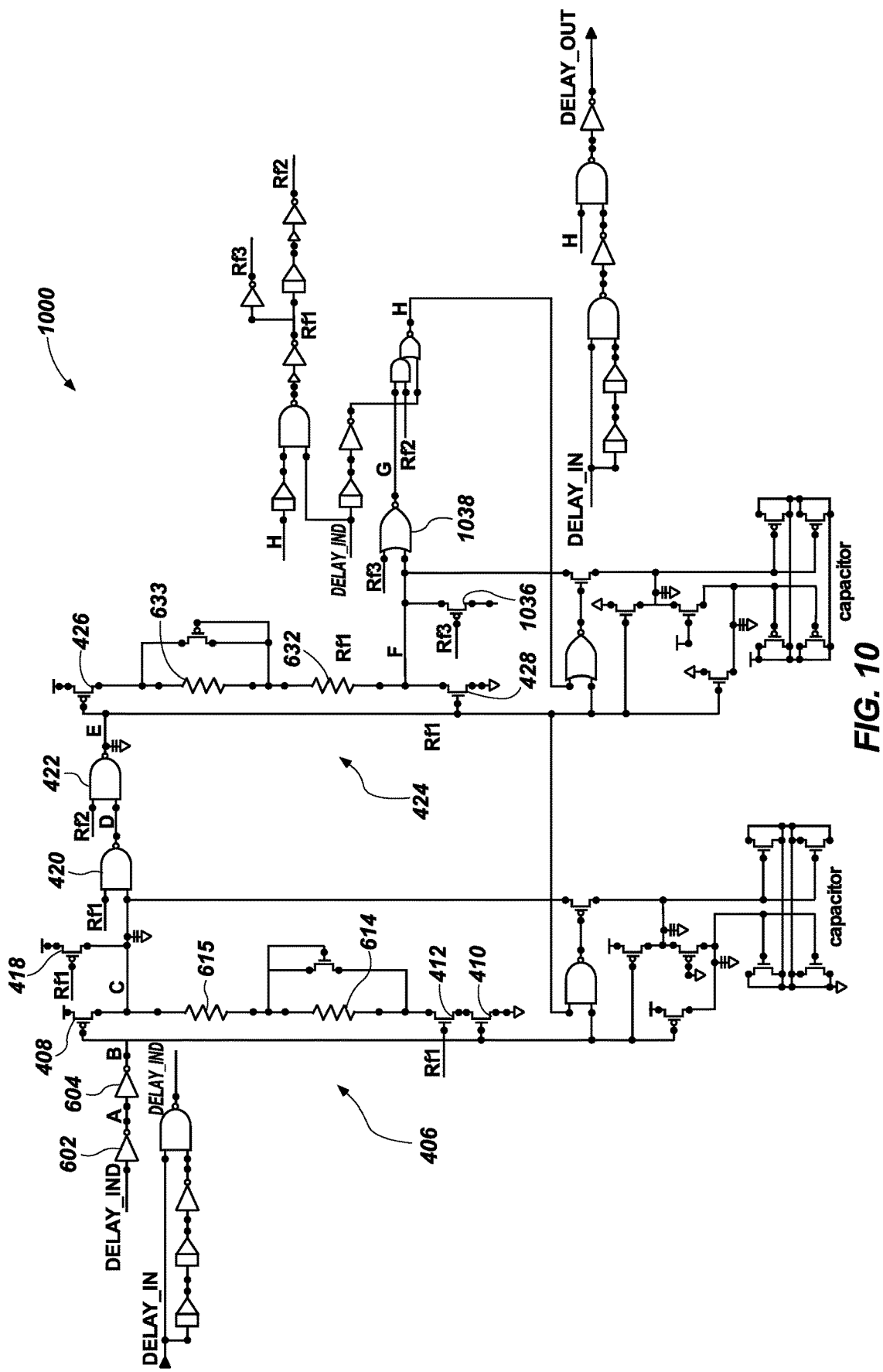
FIG. 10 is a schematic diagram of an RC delay circuit for control signals of a memory array according to another embodiment of the disclosure.

FIG. 10 is a schematic diagram of an RC delay circuit 1000 for control signals of a memory array according to another embodiment of the disclosure. The RC delay circuit 1000 may be similar to the embodiment of FIG. 8, with the exception of one or more NOR gates replacing one or more NAND gates. In particular, NOR gate 1038 (FIG. 10) replaces the NAND gate 438 (FIG. 8) coupled to the output of the second RC load inverter 424 by receiving the signal at Node F as one of the NOR gate's 1038 inputs. In addition, transistor 1036 (e.g., NMOS transistor) may be coupled to the output at Node F as a pull down transistor for the NOR gate 1038 responsive to a third reset signal Rf3 that is an inverted version of the first reset signal Rf1.

Figure 11:
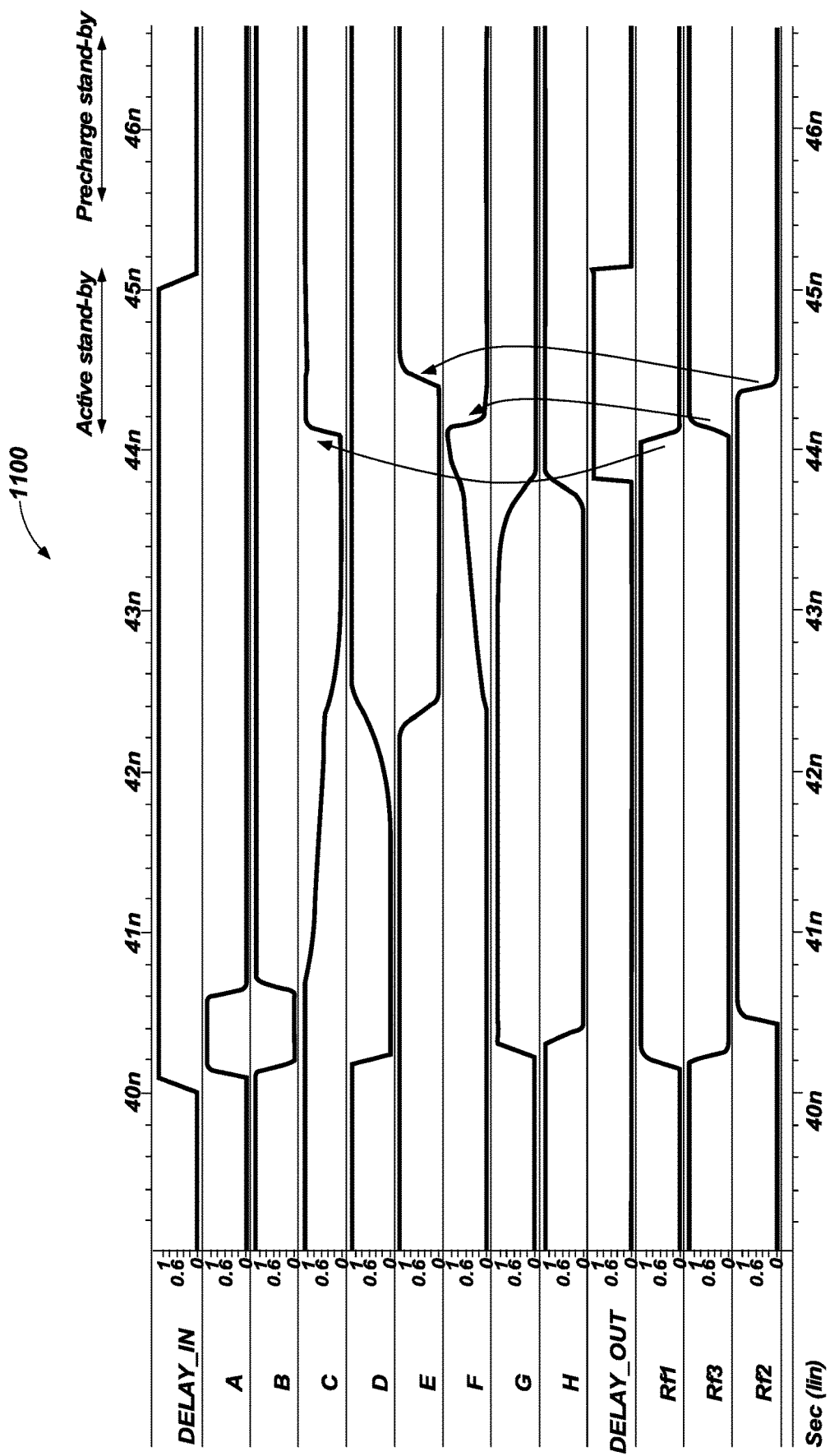
FIG. 11 is a timing diagram showing waveforms for each input (DELAY_IN), output (DELAY_OUT), reset signal Rf1, reset signal Rf2, reset signal Rf3, and various internal nodes of FIG. 10.

FIG. 11 is a timing diagram 1100 showing waveforms for each input (DELAY_IN), output (DELAY_OUT), reset signal Rf1, reset signal Rf2, reset signal Rf3, and various internal nodes of FIG. 10. In operation, Node F is slanted by the RC time constant when it transitions from low to high. As a result, the trip point of the Node G is dominant by the threshold voltage Vth of the NMOS transistor 1036 (as opposed to the threshold voltage Vth of a PMOS transistor). The transition timing of Node G may be vulnerable to PBTI (positive bias temperature instability) stress. In order to mitigate the PBTI stress at Node F, the third reset signal Rf3 and NOR gate 1038 are introduced. As a result, the RC delay circuit 1000 configured with NAND gates for the first stage, and NOR gates for the second stage may exhibit reliability to both NBTI and PBTI degradations.

Embodiments of the disclosure further include a semiconductor device comprising an RC delay circuit in a delay path for a control signal of the semiconductor device. The RC delay circuit includes at least one RC load inverter exhibiting an RC time constant on its output node, wherein the RC delay circuit is configured to pull up the output node to a voltage level responsive to a reset signal.

Figure 12:
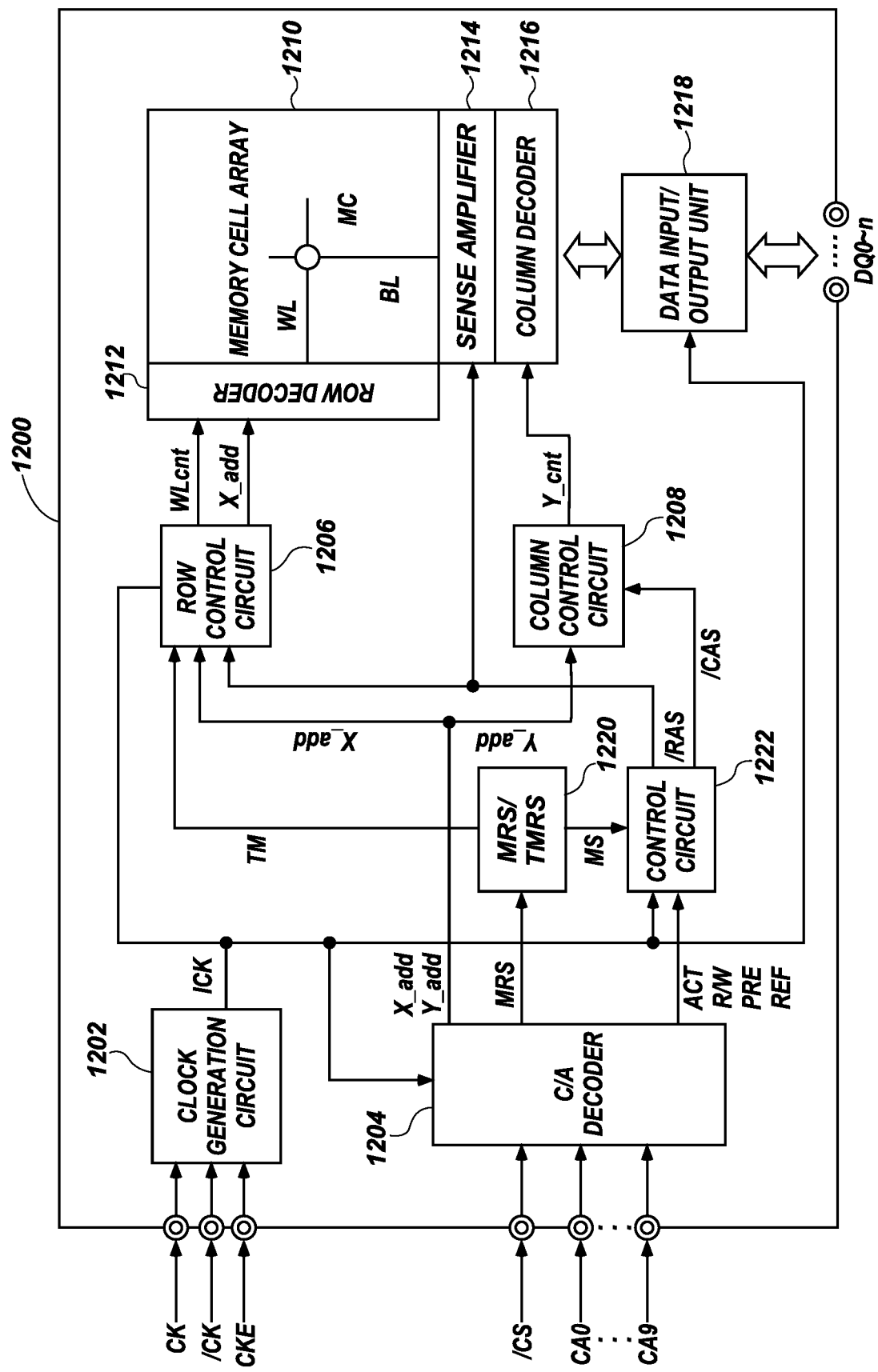
FIG. 12 is a simplified schematic block diagram of a semiconductor device according to an embodiment of the disclosure.

FIG. 12 is a simplified schematic block diagram of a semiconductor device 1200 according to an embodiment of the disclosure. The semiconductor device 1200 may be configured as a dynamic random-access memory (DRAM) device or other type of memory device. In some embodiments, the semiconductor device 1200 may be incorporated within an electronic system (e.g., a computing system) including a processor, memory device, I/O devices, etc. In further embodiments, the semiconductor device 1200 may be incorporated in a so-called system on a chip (SoC) incorporating a processor and a memory device. In yet other embodiments, a large number of semiconductor devices 1200 may be incorporated and/or fabricated within a semiconductor wafer, the semiconductor devices being singulated subsequently into semiconductor dice.

The semiconductor device 1200 includes a clock generation circuit 1202, a command/address (C/A) decoder 1204, a row control circuit 1206, a column control circuit 1208, a memory cell array 1210, a row decoder 1212, a sense amplifier (SA) 1214, a column decoder 1216, a data input/output unit 1218, a mode register/test mode register (MRS/TMRS) 1220, and a control circuit 1222. The semiconductor device 1200 may further include clock terminals (CK,/CK, and CKE), control signal terminals (/CS and CA0 to CA9), and data terminals (DQ0 to DQn).

The clock generation circuit 1202 may be configured to generate, based on clock signals CK and /CK and a clock enable signal CKE, which are supplied from the outside through the clock terminals, an internal clock signal ICK to be used in circuits in the semiconductor device 1200.

The C/A decoder 1204 may be configured to receive a chip select signal/CS and command/address signals CA0 to CA9, which may be supplied from an external device through control signal terminals, and generate various internal control signals. The various internal control signals may include an activation command ACT, a read/write command R/W, a precharge command PRE, an auto-refresh command REF, a mode register set command MRS, internal address signals X_add (internal row address signal) and Y_add (internal column address signal), etc.

The MRS/TMRS 1220 may be configured to generate an operation mode signal MS and a test mode signal TM in response to the mode register set command MRS supplied from the C/A decoder 1204.

The control circuit 1222 receives the internal control signal ACT, R/W, PRE, or REF, which is supplied from the C/A decoder 1204, and the operation mode signal MS, which is supplied from the MRS/TMRS 1220. The control circuit 1222 may be configured to generate a row operation control signal /RAS and a column operation control signal /CAS.

The row control circuit 1206 supplies, based on the internal row address signal X_add, the row operation control signal /RAS, and the test mode signal TM, a word line control signal WLcnt and the internal row address signal X_add to the row decoder 1212. The row control circuit 1206 operates, together with the MRS/TMRS 1220 (particularly the test mode register TMRS) and the control circuit 1222, as a word-line selecting operation control unit for selecting a word line (WL) of the memory cell array 1210. The row decoder 1212 selects, based on the word line control signal WLcnt and the internal row address signal X_add, a word line WL specified by the internal row address signal X_add from among the word lines and controls the selected word line WL.

The column control circuit 1208 receives the internal address signal Y_add and the column operation control signal/CAS and supplies a row decoder control signal Y_cnt including the row address Y_add to the column decoder 1216.

The memory cell array 1210 includes word lines WL, bit lines BL, and memory cells MC. Word lines WL and bit lines BL may also be referred to as "access lines." The memory cells may be arranged in an array and located at intersections between the word lines WL and the bit lines BL.

The sense amplifier 1214 includes sense amplifier circuits coupled to the corresponding bit lines BL. The sense amplifier circuits are controlled to an active state or an inactive state depending on the row operation control signal/RAS supplied from the control circuit 1222. The sense amplifier circuits in the active state amplify data read from the memory cells MC to the corresponding bit lines BL.

The column decoder 1216 selectively couples a sense amplifier circuit specified by the internal column address signal Y_add of the plurality of sense amplifier circuits to the data input/output unit 1218.

The data input/output unit 1218 outputs read data supplied from the sense amplifier circuits to the outside through the data terminals DQ. The data input/output unit 1218 also supplies write data, which are supplied from the outside through the data terminals DQ, to the memory cell array 1210 through the column decoder 1216 and the sense amplifier 1214.

Generation of one or more of the control signals may include adding a delay with an RC delay circuit as discussed above with respect to FIGS. 4-11. In particular, the row control circuit 1206, the column control circuit 1208, the control circuit 1222 and/or other elements within the semiconductor device 1200 may include one or more RC delay circuits with reset functionality according to the embodiments of the disclosure.

As will be appreciated by those of ordinary skill in the art, embodiments of the methods and apparatus of the disclosure provide an RC delay circuit having substantially reduced NBTI degradation during a stand-by mode of operation to mitigate NBTI stress and provide high reliability.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An RC delay circuit, comprising:
   a first RC load inverter including:
      a first transistor and a second transistor operably coupled as an inverter having a common input and a common output node;
      a resistor operably coupled between the first transistor and the second transistor; and
      a capacitor operably coupled at the common output node; and
   a delay element coupled at the common output node of the first RC load inverter configured to perform an inverter operation on a signal received from the first RC load inverter,
   wherein the RC delay circuit is configured to pull up a voltage level of the common output node of the first RC load inverter responsive to a reset signal during a stand-by mode.

2. The RC delay circuit of claim 1, wherein the delay element includes an inverter that does not exhibit an RC time constant.

3. The RC delay circuit of claim 1, wherein the delay element includes a NAND gate configured to perform an inverter operation responsive to the reset signal during an active mode.

4. The RC delay circuit of claim 1, wherein the stand-by mode is one of a stand-by active mode or a stand-by precharge mode.

5. The RC delay circuit of claim 1, wherein the first RC load inverter further includes a third transistor operably coupled between the first transistor and the second transistor, the third transistor configured to be enabled responsive to the reset signal.

6. A method of operating a semiconductor device, the method comprising:
   receiving an input signal at an RC delay circuit having multiple delay stages in a delay path;
   generating a delayed output signal during an active mode of the RC delay circuit; and
   pulling at least one node of the delay path to a voltage level responsive to a reset signal during a stand-by mode of the RC delay circuit.

7. The method of claim 6, wherein generating the delayed output signal includes:
   applying a first delay through a first RC load inverter of the RC delay circuit, the first RC load inverter exhibiting a first time constant on a first node of the RC delay circuit; and
   applying a second delay through a second RC load inverter of the RC delay circuit, the second RC load inverter exhibiting a second time constant on a second node of the RC delay circuit.

8. The method of claim 7, further comprising setting the first node and the second node to a voltage level responsive to a same reset signal.

9. The method of claim 7, further comprising setting the first node and the second node to a voltage level responsive to different reset signals.

10. A semiconductor device, comprising
    a first RC load inverter including:
       a first transistor and a second transistor operably coupled as an inverter having a common input and a common output node;
       a resistor operably coupled between the first transistor and the second transistor; and
       a capacitor operably coupled at the common output node; and
    a delay element coupled at the common output node of the first RC load inverter configured to perform an inverter operation on a signal received from the first RC load inverter,
    wherein an RC delay circuit is configured to pull up a voltage level of the common output node of the first RC load inverter responsive to a reset signal during a stand-by mode.

11. The semiconductor device of claim 10, wherein the delay element includes an inverter that does not exhibit an RC time constant.

12. The semiconductor device of claim 10, wherein the delay element includes a NAND gate configured to perform an inverter operation responsive to the reset signal during an active mode.

13. The semiconductor device of claim 10, wherein the stand-by mode is one of a stand-by active mode or a stand-by precharge mode.

14. The semiconductor device of claim 10, wherein the first RC load inverter further includes a third transistor operably coupled between the first transistor and the second transistor, the third transistor configured to be enabled responsive to the reset signal.

15. The semiconductor device of claim 10, further comprising:
   a memory array;
   a row control circuit; and
   a column control circuit, wherein the first RC load inverter and the delay element are incorporated within one of the row control circuit or the column control circuit coupled to the memory array.

16. The semiconductor device of claim 10, wherein the first RC load inverter further includes a third transistor operably coupled between the resistor and the second transistor, the third transistor coupled to a reset signal as its input.

17. The semiconductor device of claim 10, wherein the first RC load inverter exhibits an RC time constant on the common output node.

18. The semiconductor device of claim 10, further comprising a second RC load inverter coupled to delay element.

19. The semiconductor device of claim 18, wherein the second RC load inverter comprises:
   a third transistor and a fourth transistor coupled to an output node of the second RC load inverter;
   a second resistor operably coupled between the third transistor and the fourth transistor; and
   a second capacitor operably coupled at the output node of the second RC load inverter.

20. The semiconductor device of claim 19, wherein the second RC load inverter further includes a fifth transistor operably coupled between the second resistor and the fourth transistor, the fifth transistor coupled to a reset signal as its input.

21. The semiconductor device of claim 19, further comprising a second delay element coupled at the output node of the second RC load inverter.

* * * * *